(12) United States Patent
Nearhoof et al.

(10) Patent No.: US 7,948,393 B2
(45) Date of Patent: *May 24, 2011

(54) LIGHTING CONTROL HAVING AN IDLE STATE WITH WAKE-UP UPON ACTUATION

(75) Inventors: Jeremy Nearhoof, Landsdale, PA (US);
Gregory Altonen, Easton, PA (US);
Christopher Buck, Bethlehem, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 4 days.

This patent is subject to a terminal disclaimer.

(21) Appl. No.: 12/541,316

(22) Filed: Aug. 14, 2009

(65) Prior Publication Data
US 2010/0007508 A1    Jan. 14, 2010

Related U.S. Application Data

(63) Continuation of application No. 11/472,246, filed on Jun. 20, 2006, now Pat. No. 7,592,925.

(51) Int. Cl.
*G08B 5/00* (2006.01)
(52) U.S. Cl. ............... 340/815.4; 315/291; 315/362
(58) Field of Classification Search ............. 340/815.4; 315/120, 129, 136, 291, 307, 360, 362; 307/139, 307/141
See application file for complete search history.

(56) References Cited

U.S. PATENT DOCUMENTS

| | | | | |
|---|---|---|---|---|
| 4,520,295 A | * | 5/1985 | Bolhuis | 315/291 |
| 4,764,708 A | * | 8/1988 | Roudeski | 307/125 |
| 5,212,478 A | * | 5/1993 | Moseley | 315/291 |
| 5,248,919 A | | 9/1993 | Hanna et al. | |
| 5,399,940 A | | 3/1995 | Hanna et al. | |
| 5,430,356 A | | 7/1995 | Ference et al. | |
| 5,781,869 A | * | 7/1998 | Parlett et al. | 307/10.1 |
| 5,808,294 A | * | 9/1998 | Neumann | 315/159 |

(Continued)

FOREIGN PATENT DOCUMENTS

GB        2 233 841 A    1/1991

(Continued)

OTHER PUBLICATIONS

Lutron Electronics Co., Inc., *Viseo Display Control Operation Manual*, Jan. 2002, 32 pages.

*Primary Examiner* — John A Tweel, Jr.
(74) *Attorney, Agent, or Firm* — Ostrolenk Faber LLP

(57) ABSTRACT

A load control device for controlling the amount of power delivered from an AC power source to an electrical load, the load control device comprising a bidirectional semiconductor switch operable to be coupled in series electrical connection between the source and the load, the semiconductor switch having a control input; a controller operatively coupled to the control input of the semiconductor switch for controlling the amount of power delivered to the load; an actuator operatively coupled to the controller such that the controller is operable to determine a desired amount of power to be delivered to the load in response to actuations of the actuator; and a visual display responsive to the controller; wherein the controller is operable to illuminate the visual display to a first intensity upon actuation of the actuator and to subsequently illuminate the visual display to a second intensity less than the first intensity after a predetermined amount of time has elapsed since the actuation of the actuator.

25 Claims, 15 Drawing Sheets

U.S. PATENT DOCUMENTS

| | | | |
|---|---|---|---|
| 5,994,844 A * | 11/1999 | Crawford et al. | 315/151 |
| 6,055,079 A * | 4/2000 | Hagans et al. | 307/10.1 |
| 7,592,925 B2 * | 9/2009 | Nearhoof et al. | 340/815.4 |
| 2005/0121980 A1 | 6/2005 | Bruwer | |
| 2005/0146288 A1 | 7/2005 | Johnson et al. | |
| 2006/0007684 A1 | 1/2006 | Wang | |
| 2006/0103331 A1 | 5/2006 | Johnson et al. | |

FOREIGN PATENT DOCUMENTS

| | | |
|---|---|---|
| WO | WO 2006/027259 | 3/2006 |

* cited by examiner

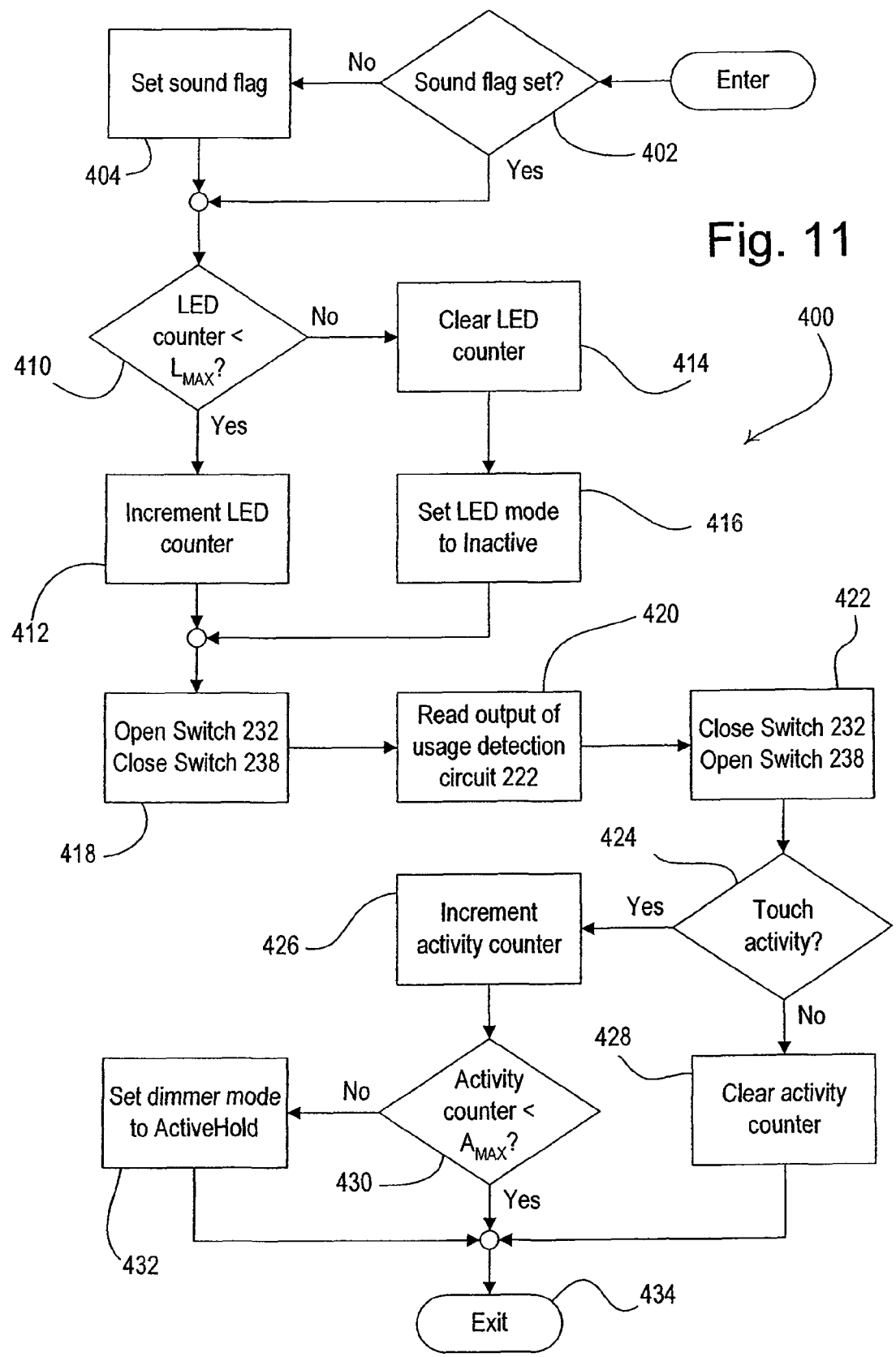

LIGHTING CONTROL HAVING AN IDLE STATE WITH WAKE-UP UPON ACTUATION

CROSS-REFERENCE TO RELATED APPLICATION

This is a continuation of U.S. patent application Ser. No. 11/472,246, filed Jun. 20, 2006 entitled LIGHTING CONTROL HAVING AN IDLE STATE WITH WAKE-UP UPON ACTUATION, now U.S. Pat. No. 7,592,925.

BACKGROUND OF THE INVENTION

1. Field of the Invention

The present invention relates to load control devices for controlling the amount of power delivered to an electrical load from a power source. More specifically, the present invention relates to a dimmer having a plurality of status indicators that illuminate to a dim level after a predetermined amount of time of inactivity.

2. Description of the Related Art

A conventional two-wire dimmer has two terminals: a "hot" terminal for connection to an alternating-current (AC) power supply and a "dimmed hot" terminal for connection to a lighting load. Standard dimmers use one or more semiconductor switches, such as triacs or field effect transistors (FETs), to control the current delivered to the lighting load and thus to control the intensity of the light. The semiconductor switches are typically coupled between the hot and dimmed hot terminals of the dimmer.

Smart wall-mounted dimmers include a user interface typically having a plurality of buttons for receiving inputs from a user and a plurality of status indicators for providing feedback to the user. These smart dimmers typically include a microcontroller or other processing device for providing an advanced set of control features and feedback options to the end user. An example of a smart dimmer is described in greater detail in commonly assigned U.S. Pat. No. 5,248,919, issued on Sep. 28, 1993, entitled LIGHTING CONTROL DEVICE, which is herein incorporated by reference in its entirety.

FIG. 1 is a front view of a user interface of a prior art smart dimmer switch 10 for controlling the amount of power delivered from a source of AC power to a lighting load. As shown, the dimmer switch 10 includes a faceplate 12, a bezel 14, an intensity selection actuator 16 for selecting a desired level of light intensity of a lighting load (not shown) controlled by the dimmer switch 10, and a control switch actuator 18. Actuation of the upper portion 16A of the intensity selection actuator 16 increases or raises the light intensity of the lighting load, while actuation of the lower portion 16B of the intensity selection actuator 16 decreases or lowers the light intensity. The intensity selection actuator 16 may control a rocker switch, two separate push switches, or the like. The control switch actuator 18 may control a push switch or any other suitable type of actuator and typically provides tactile and auditory feedback to a user when pressed.

The smart dimmer 10 also includes an intensity level indicator in the form of a plurality of light sources 20, such as light-emitting diodes (LEDs). Light sources 20 may be arranged in an array (such as a linear array as shown) representative of a range of light intensity levels of the lighting load being controlled. The intensity level of the lighting load may range from a minimum intensity level, which is preferably the lowest visible intensity, but which may be zero, or "full off," to a maximum intensity level, which is typically "full on." Light intensity level is typically expressed as a percentage of full intensity. Thus, when the lighting load is on, light intensity level may range from 1% to 100%.

By illuminating a selected one of the light sources 20 depending upon light intensity level, the position of the illuminated light source within the array provides a visual indication of the light intensity relative to the range when the lamp or lamps being controlled are on. For example, seven LEDs are illustrated in FIG. 1. Illuminating the uppermost LED in the array will give an indication that the light intensity level is at or near maximum. Illuminating the center LED will give an indication that the light intensity level is at about the midpoint of the range. In addition, when the lamp or lamps being controlled are off, all of the light sources 20 are illuminated at a low level of illumination, while the LED representative of the present intensity level in the on state is illuminated at a higher illumination level. This enables the light source array to be more readily perceived by the eye in a darkened environment, which assists a user in locating the switch in a dark room, for example, in order to actuate the switch to control the lights in the room, and provides sufficient contrast between the level-indicating LED and the remaining LEDs to enable a user to perceive the relative intensity level at a glance. Further, the magnitude of the low level of illumination that the LEDs are controlled to when the lighting load is off is determined such that the light sources 20 are bright enough to be visible in direct sunlight.

According to the present invention, a control structure for an electrical control system for producing a variable output electrical signal to an electrical load for controllably varying the output of said load, comprising: (1) an enclosed volume which contains control electronics; (2) a cover plate on one surface of said enclosed volume having a planar front surface and having a rectangular opening therein; (3) a touch pad disposed in said rectangular opening and coupled to said control electronics and adapted to produce an output signal which is related to the position within the area of said touch pad at which said touch pad is touched by an operator; (4) a plurality of status indicators; and (5) a voltage source for energizing said status indicators, said voltage source being switchable between first and second conditions for illuminating said status indicators at a first and low intensity and at a second and high intensity; said voltage source being normally switched to its said first condition for illuminating said status indicators with said low intensity; and circuit means coupled to said touch screen for switching said voltage source to said second condition for a predetermined length of time following the initial excitation of any of said status indicators by said touch screen, and thereafter returning said voltage source to said first condition.

In addition, the present invention provides a control structure for an electrical control system for producing a variable output electrical signal to an electrical load for controllably varying the output of said load. The control structure comprises: (1) an enclosed volume which contains control electronics; (2) a cover plate on one surface of said enclosed volume having a planar front surface and having a rectangular opening therein; (3) a transparent touch pad disposed in said rectangular opening and coupled to said control electronics and adapted to produce an output signal which is related to the position within the area of said touch pad at which said touch pad is touched by an operator; (4) a plurality of vertically arranged markers printed on said touch pad to serve as scale indicator; (5) a plurality of status indicators coupled to said control electronics for illuminating respective discrete locations on said touch pad which lie on a line along the length of said touch pad and in a predetermined alignment with respective ones of said printed markers and being respectively illuminated adjacent the position on said touch pad at which said touch pad is touched by an operator; (6) a small marker at the bottom of said touch pad and in the center of the width of said touch pad for toggling said electrical circuit when said touch pad is touched at said small marker location; (7) at least a first status indicator connected to said control electronics and positioned to illuminate said small marker and when said touch pad is touched at said small marker to turn off said electrical circuit; and (8) a voltage source for energizing said status indicators, said voltage source being switchable between first and second conditions for illuminating said status indicators at a first and low intensity and at a second and high intensity, said voltage source being normally switched to said first condition for illuminating said status indicators with said low intensity; and circuit means coupled to said touch screen for switching said voltage source to said second condition for a predetermined length of time following the initial excitation of any of said status indicators by said touch screen, and thereafter returning said voltage source to said first condition.

The present invention further provides a control structure for an electrical control system for producing a variable output electrical signal to an electrical load for controllably varying the output of said load. The control structure comprises: (1) an enclosed volume which contains control electronics; (2) an actuator; (3) a plurality of status indicators; and (4) a voltage source for energizing said status indicators, said voltage source being switchable between first and second conditions for illuminating said status indicators at a first and low intensity and at a second and high intensity, said voltage source being normally switched to its said first condition for illuminating said status indicators with said low intensity; and circuit means coupled to said touch screen for switching said voltage source to said second condition for a predetermined length of time following the initial excitation of any of said status indicators in response to an actuation of said actuator and thereafter returning said voltage source to said first condition.

Other features and advantages of the present invention will become apparent from the following description of the invention that refers to the accompanying drawings.

BRIEF DESCRIPTION OF THE DRAWINGS

FIG. 11 is a flowchart of an Idle procedure of the touch dimmer procedure of FIG. 10;

DETAILED DESCRIPTION OF THE INVENTION

Figure 1:
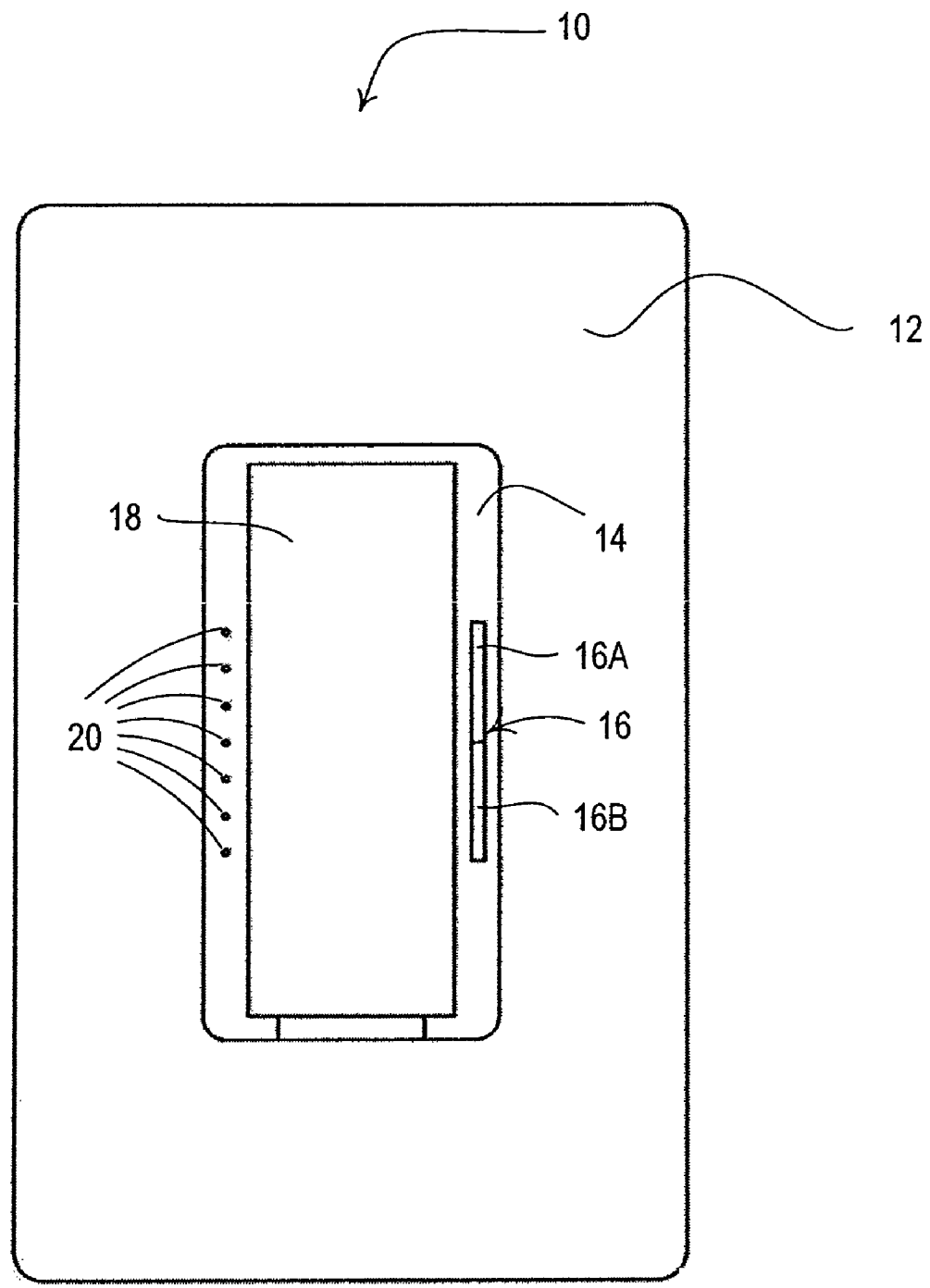
FIG. 1 is a front view of a user interface of a prior art dimmer.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

Figure 2:
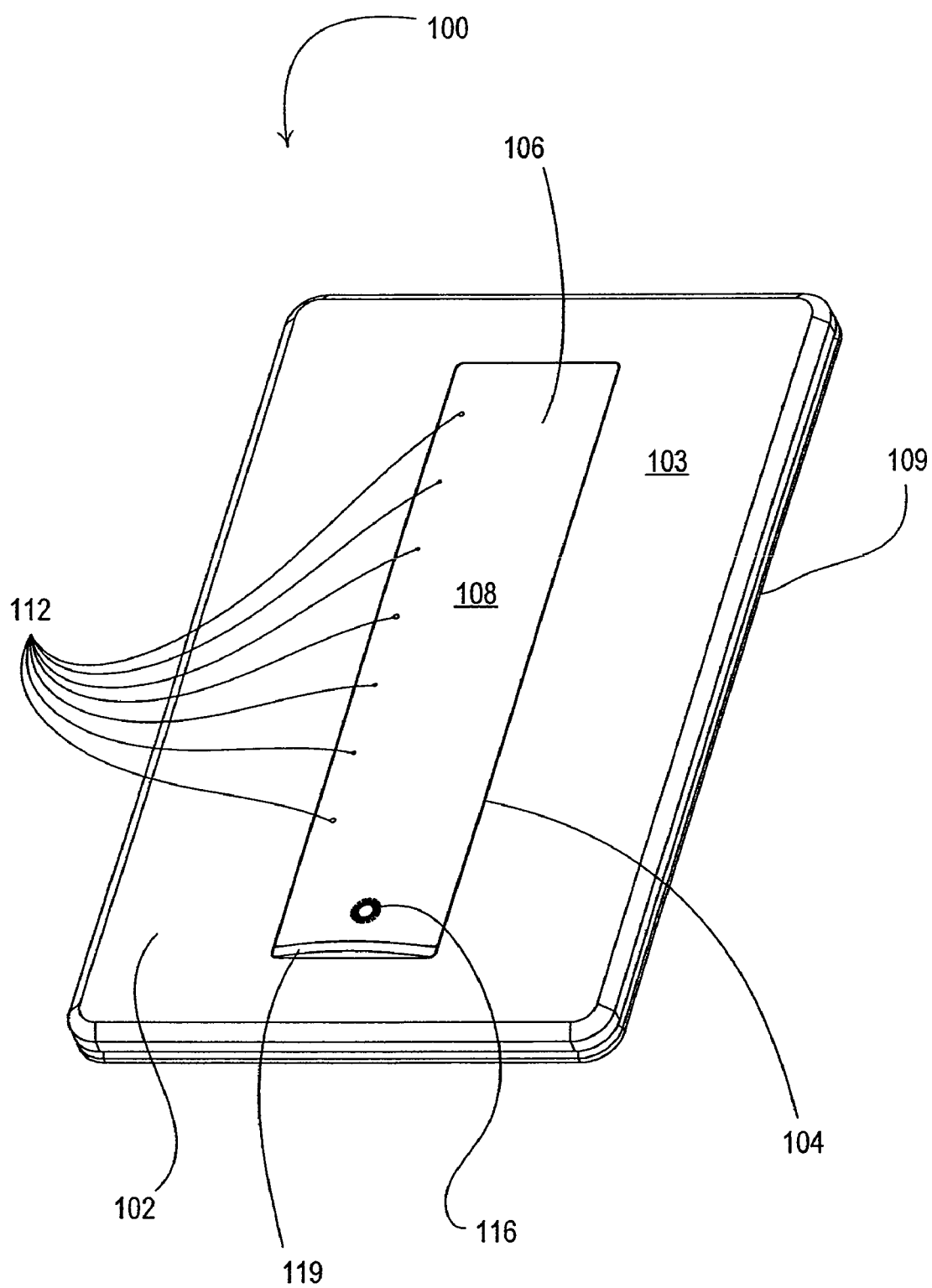
FIG. 2 is a perspective view of a touch dimmer according to the present invention.
Figure 3:
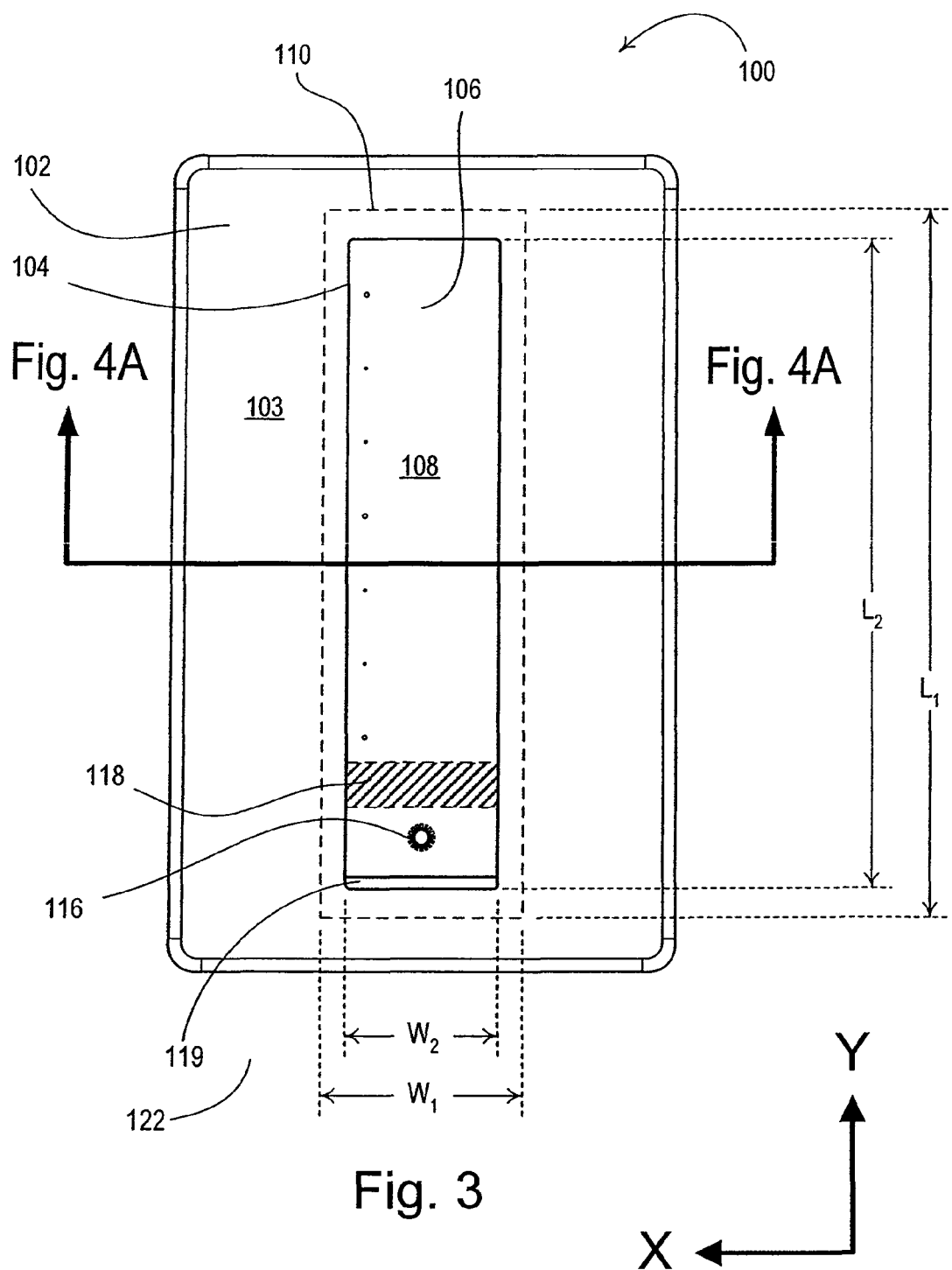
FIG. 3 is a front view of the touch dimmer of FIG. 2.

FIGS. 2 and 3 are a perspective view and a front view, respectively, of a touch dimmer 100 according to the present invention. The dimmer 100 includes a faceplate 102, i.e., a cover plate, having a planar front surface 103 and an opening 104. The opening 104 may define a standard industry-defined opening, such as a traditional opening or a decorator opening, or another uniquely-sized opening as shown in FIG. 2. A bezel 106 having a planar touch sensitive front surface 108 extends through the opening 104 of the faceplate 102. The front surface 108 of the bezel 106 is positioned immediately above a touch sensitive device 110 (shown in FIGS. 4A and 4B), such that a user of the dimmer 100 actuates the touch sensitive element 110 by pressing the front surface 108 of the bezel 106. As shown in FIG. 2, the front surface 108 of the bezel 106 is substantially flush with the front surface 103 of the faceplate 102, i.e., the plane of the front surface 108 of the bezel 106 is coplanar with the plane of the front surface 103 of the faceplate 102. However, the bezel 106 may extend through the opening 104 of the faceplate 102 such that the front surface 108 of the bezel is provided in a plane above the plane of the front surface 103 of the faceplate 102. The faceplate 102 is connected to an adapter 109, which is connected to a yoke (not shown). The yoke is adapted to mount the dimmer 100 to a standard electrical wallbox.

The dimmer 100 further comprises a visual display, e.g., a plurality of status markers 112 provided in a linear array along an edge of the front surface 108 of the bezel 106. The status markers 112 are preferably illuminated from behind by status indicators 114, e.g., light-emitting diodes (LEDs), located internal to the dimmer 100 (see FIG. 7). The dimmer 100 preferably comprises a light pipe (not shown) having a plurality of light conductors to conduct the light from the status indicators 114 inside the dimmer to the markers 112 on the front surface 108 of the bezel 106. The status indicators 114 behind the markers 112 are preferably blue. As shown in FIGS. 2 and 3, the dimmer 100 comprises seven (7) status markers 112. However, the dimmer 100 may comprise any number of status markers. Further, the status markers 112 may be disposed in a vertical linear array along the center of the front surface 108 of the bezel 106. The markers 112 may comprise shadows apparent on the front surface 108 due to voids behind the front surface.

Preferably, the status markers are illuminated to display the intensity of the connected lighting load 208 (FIG. 7) as feedback to a user. One of the status markers 112 is illuminated depending upon light intensity level, such that the position of the illuminated status marker 112 within the linear array provides a visual indication of the light intensity relative to the lighting intensity range of the lighting load 208. Illuminating the uppermost status marker 112 in the array will give an indication that the light intensity level is at or near maximum. Illuminating the center status marker 112 will give an indication that the light intensity level is at about the midpoint of the range. Further, when the lighting load 208 is off, all of the markers 112 are illuminated at a low level of illumination, while the status marker representative of the present intensity level (when the lighting load is on) is illuminated at a higher illumination level. Alternatively, a plurality of adjacent status indicators 114 could be illuminated in a "bar graph" fashion to display the intensity of the lighting load 208. For example, if the intensity is near the midpoint of the range, the lower four status indicators of the seven status indicators could be illuminated. Further, to indicate the maximum intensity, all of the status indicators 114 could be illuminated.

The front surface 108 of the bezel 106 further includes an icon 116. The icon 116 may be any sort of visual marker, such as, for example, a dot. Upon actuation of the lower portion of the front surface 108 surrounding the icon 116, the dimmer 100 causes a connected lighting load 208 (FIG. 7) to change from on to off (and vice versa), i.e., to toggle. Preferably, a blue status indicator and an orange status indicator are located immediately behind the icon 116, such that the icon 116 is illuminated with blue light when the lighting load 208 is on and illuminated with orange light when the lighting load is off. Actuation of the upper portion of the front surface 108, i.e., above the portion surrounding the icon 116, causes the intensity of the lighting load 208 to change. The status indicators 114 behind the status markers 112 are illuminated to display the intensity of the lighting load 208. For example, if the lighting load 208 is at 50% lighting intensity, the middle status indicator will be illuminated. Preferably, the dimmer 100 does not respond to actuations in a keepout region 118 of the front surface 108. The keepout region 118 prevents inadvertent actuation of an undesired portion of the front surface 108 during operation of the dimmer 100.

According to the present invention, the dimmer 100 uses an "LED mode" to control the intensity of the status indicators 114. When a user actuates the touch sensitive device 110, the dimmer 100 temporarily enters an active LED mode, in which the status indicators 114 are illuminated to a bright Active level, such that the light illuminating the status markers 112 is viewable in direct sunlight, e.g., 500 footcandles. Accordingly, the dimmer 100 "wakes up", i.e., the active LED mode is initiated, in response to an actuation of the touch sensitive device 110. After a predetermined period of time $t_{ACTIVE}$, e.g., 5 seconds, after the user stops actuating, i.e., releases, the touch sensitive device 110, the dimmer 100 enters the inactive LED mode and the status indicators are illuminated to a dim Idle level. At this time, if the lighting load 208 is on, the light illuminating the dimly lit status markers 112 are viewable in less than 10 footcandles and the light illuminating the intensity level status indicator is viewable in less than 250 footcandles. Further, when the lighting load 208 is toggled off and the dimmer 100 is in the inactive LED mode, the status indicators 114 are illuminated to a dim Off level, which is lower in intensity than the dim Idle level. Preferably, the status indicators 114 are faded from the bright Active level to both the dim Idle level and the dim Off level. "Fading" means the status indicators 114 are dimmed over a period of time, e.g., 0.5 seconds and 0.75 seconds for the dim Idle level and the dim Off level, respectively.

Figure 7:
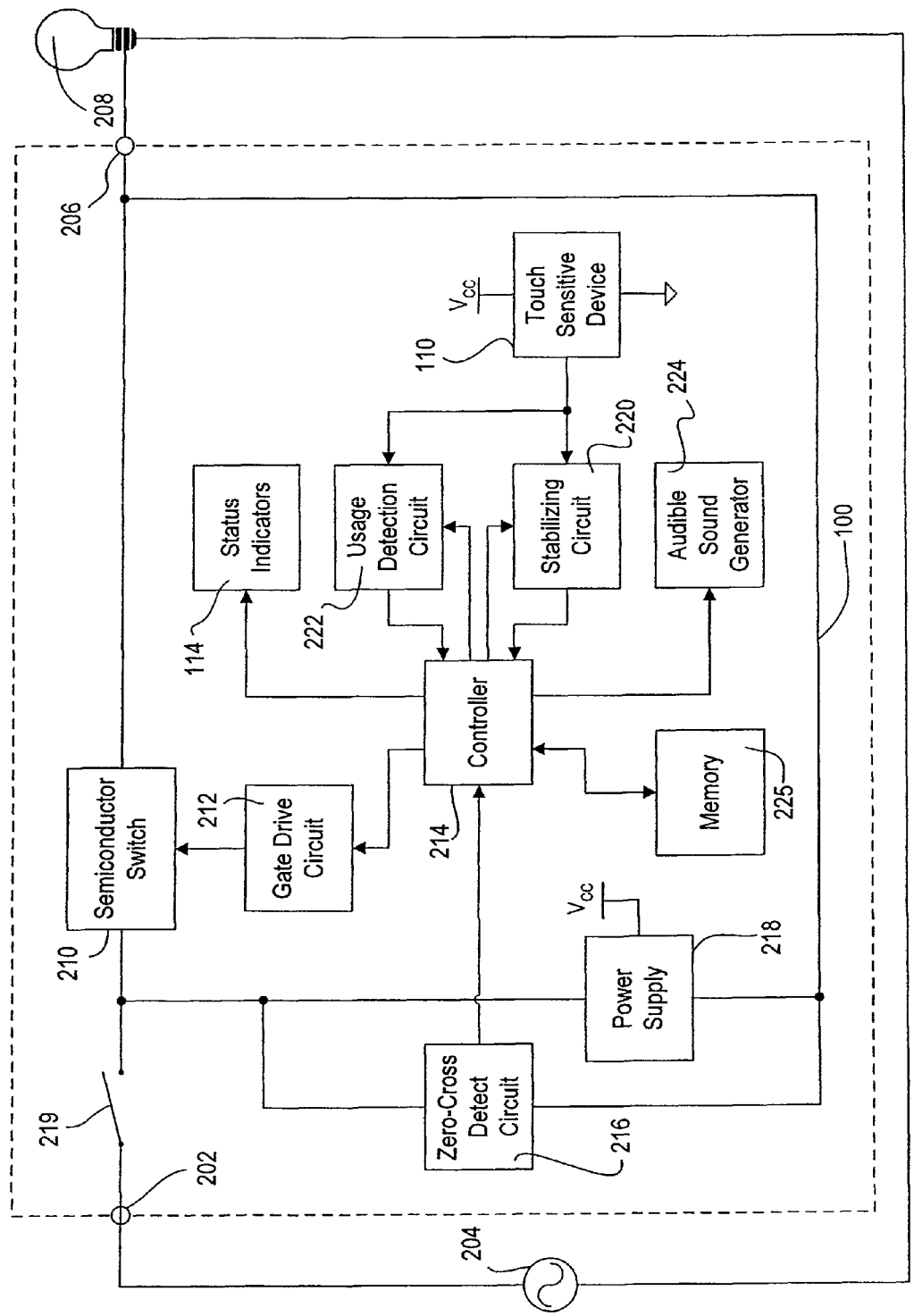
FIG. 7 is a simplified block diagram of the touch dimmer of FIG. 2.

The dimmer 100 further includes an airgap switch actuator 119. Pulling the airgap switch actuator 119 opens a mechanical airgap switch 219 (FIG. 7) inside the dimmer 100 and disconnects the lighting load 208 from a connected AC voltage source 204 (FIG. 7). The airgap switch actuator 119 extends only sufficiently above the front surface 103 of the faceplate 102 to be gripped by a fingernail of a user. The electronic circuitry of the dimmer 100 (to be described in greater detail below) is mounted on a printed circuit board (PCB) (not shown). The PCB is housed in an enclosure (not shown), i.e., an enclosed volume, which is attached to the yoke of the dimmer 100.

Figure 4A:
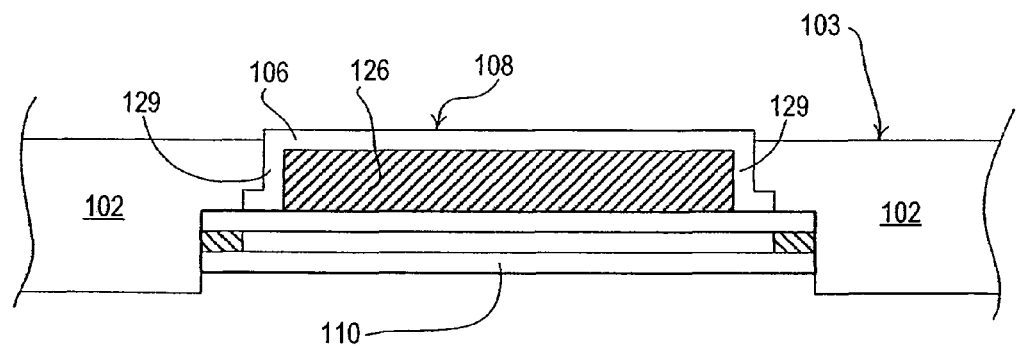
FIG. 4A is a partial assembled sectional view of a bezel and a touch sensitive device of the touch dimmer of FIG. 2.
Figure 4B:
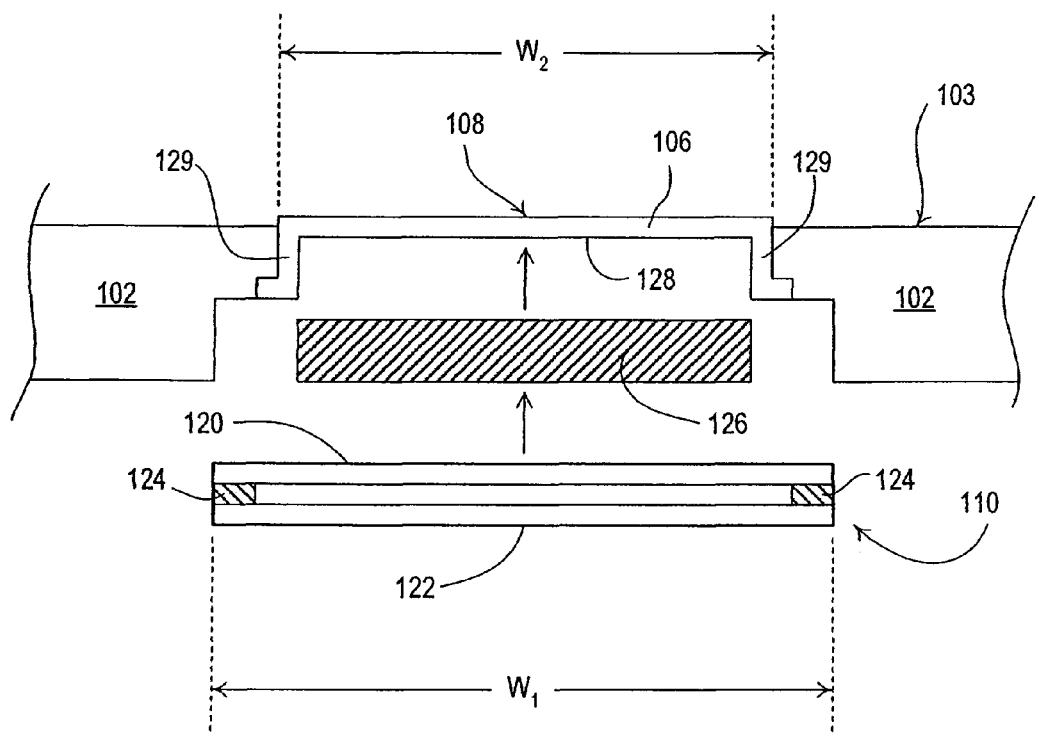
FIG. 4B is a partial exploded sectional view of the bezel and the touch sensitive device of FIG. 4A.
Figure 5:
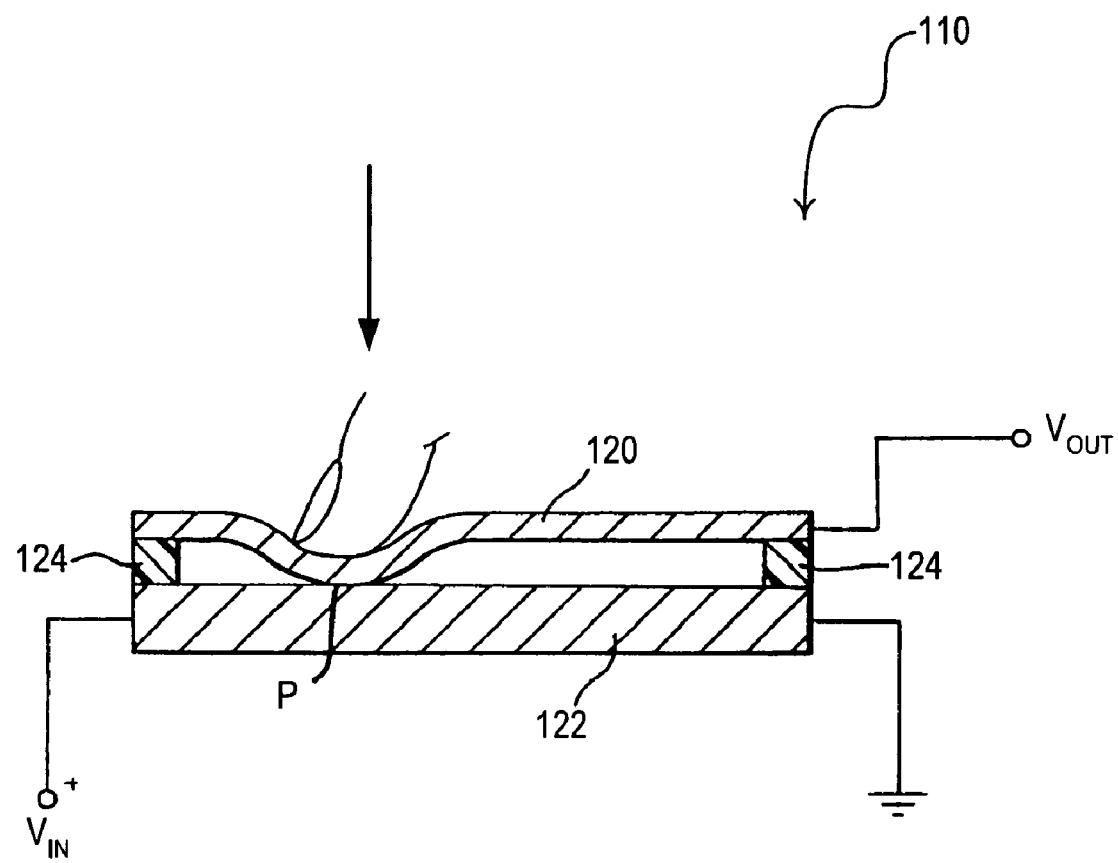
FIG. 5 is a cross-sectional view of the touch sensitive device.

FIG. 4A is a partial assembled sectional view and FIG. 4B is a partial exploded sectional view of the bezel 108 and the touch sensitive device 110 of the dimmer 100 according to the present invention. FIG. 5 is a cross-sectional view of the touch sensitive device 110, specifically, a membrane voltage divider or a resistive divider. A conductive element 120 and a resistive element 122 are co-extensively supported in close proximity by a spacing frame 124. An input voltage, $V_{IN}$, is applied across the resistive element 122 to provide a voltage gradient across its surface. When pressure is applied at a point P along the conductive element 120 (by a finger or the like), the conductive element flexes downward and electrically contacts a corresponding point along the surface of the resistive element 122, providing an output voltage, $V_{OUT}$, whose value is between the input voltage $V_{IN}$ and ground. When pressure is released, the conductive element 120 recovers its original shape and becomes electrically isolated from the resistive element 122. The touch-operated device 110 is characterized by a contact resistance $R_{CONTACT}$ between the conductive element 120 and the resistive element 122. The contact resistance $R_{CONTACT}$ is dependent upon the force of the actuation of the touch-operated device 110 and is typically substantially small for a normal actuation force.

An elastomer 126 is received by an opening 128 in the rear surface of the bezel 106. The elastomer 126 is positioned between the bezel 106 and the touch sensitive device 110, such that a press on the front surface 108 of the bezel is transmitted to the conductive element 120 of the touch sensitive device 110. Preferably, the elastomer 126 is made of rubber and is 0.040" thick. The elastomer 126 preferably has a durometer of 40 A, but may have a durometer in the range of 20 A to 80 A. The conductive element 120 and the resistive element 122 of the touch sensitive device 110 and the elastomer 126 are preferably manufactured from a transparent material such that the light from the plurality of status indicators 114 inside the dimmer 100 are operable to shine through the touch sensitive device 110 and the elastomer 126 to front surface 108 of the bezel 106.

The position and size of the touch sensitive device 110 is demonstrated by the dotted line in FIG. 3. The touch sensitive device 110 has a length $L_1$ and a width $W_1$ that is larger than a length $L_2$ and a width $W_2$ of the front surface 108 of the bezel 106. Accordingly, a first area $A_1$ of the surface of touch sensitive device 110 (i.e., $A_1=L_1 \cdot W_1$) is greater than a second area $A_2$ of the front surface 108 of the bezel 106 (i.e., $A_2=L_2 \cdot W_2$). An orthogonal projection of the second area $A_2$ onto the first area $A_1$ is encompassed by the first area $A_1$, such that a point actuation at any point on the front surface 108 of the bezel 106 is transmitted to the conductive element 120 of the touch sensitive device 110. As shown in FIGS. 2 and 3, the length $L_2$ of the front surface 108 of the bezel 106 is approximately four (4) times greater than the width $W_2$. Preferably, the length $L_2$ of the front surface 108 of the bezel 106 is four (4) to six (6) times greater than the width $W_2$. Alternatively, the front surface 108 of the bezel 106 may be provided in an opening of a decorator-style faceplate faceplate.

Figure 6:
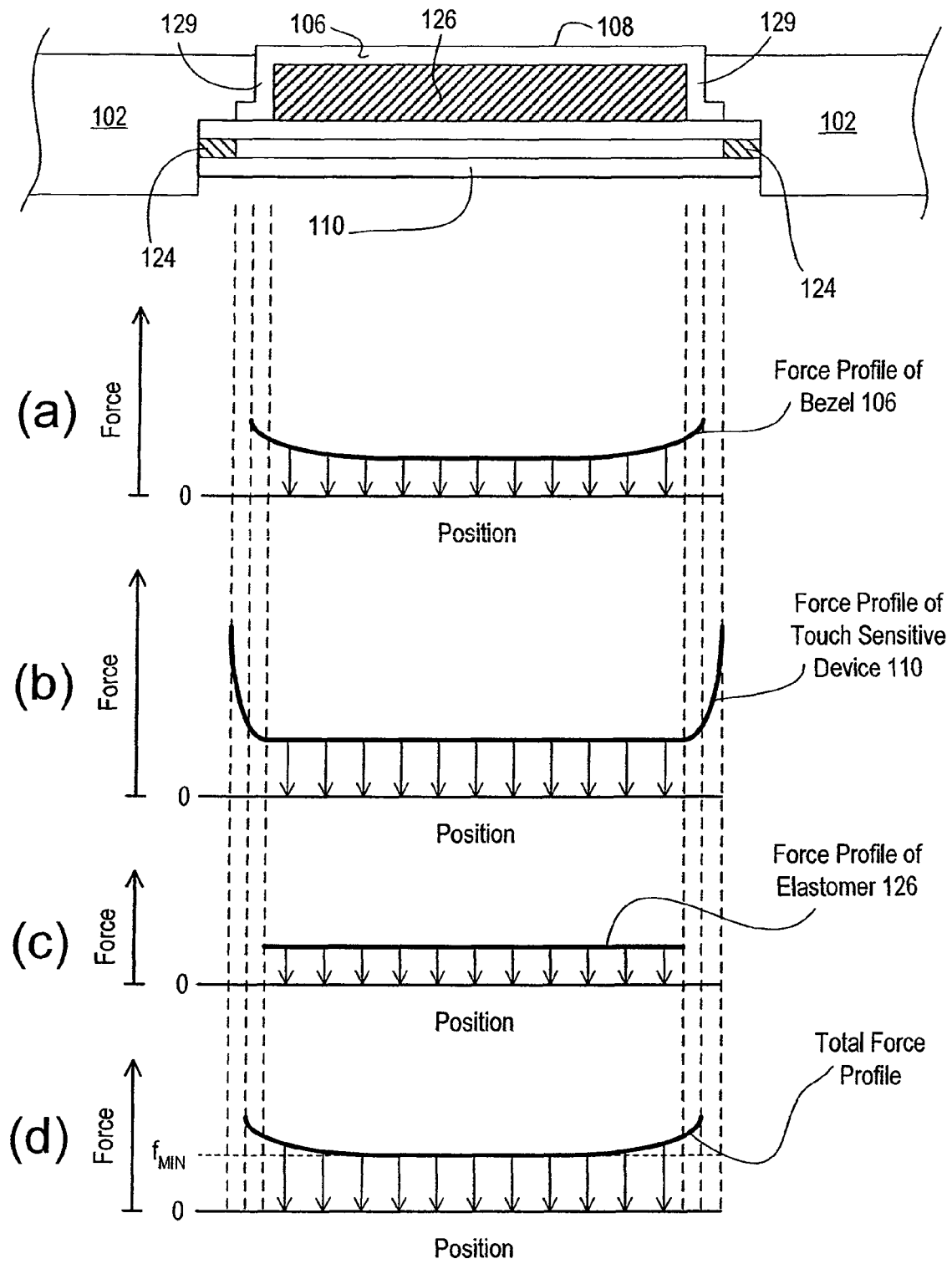
FIG. 6 shows the force profiles of the components and a cumulative force profile of the touch dimmer of FIG. 2.

FIG. 6 shows the force profiles of the components of the dimmer 100 shown in FIGS. 4A and 4B and a cumulative force profile for the touch sensitive device 110 of the dimmer 100. Each of the force profiles shows the force required to actuate the touch sensitive device 110 with respect to the position of the point actuation. The force profile represents the amount of force required to displace the element by a given amount. While the force profiles in FIG. 6 are shown with respect to the widths of the components of the dimmer 100, a similar force profile is also provided along the length of the components.

FIG. 6(a) shows a force profile of the bezel 106. The bezel 106 has substantially thin sidewalls 129, e.g., 0.010" thick, such that the bezel 106 exhibits a substantially flat force profile. FIG. 6(b) shows a force profile of the touch sensitive device 110. The force required to actuate the touch sensitive device 110 increases near the edges because of the spacing frames 124. FIG. 6(c) shows a force profile of the elastomer 126. The force profile of the elastomer 126 is substantially flat, i.e., a force at any point on the front surface of the elastomer 126 will result in a substantially equal force at the corresponding point on the rear surface.

FIG. 6(d) is a total force profile of the touch dimmer 100. The individual force profiles shown in FIGS. 6(a)-6(c) are additive to create the total force profile. The total force profile is substantially flat across the second area $A_2$ of the front surface 108 of the bezel 106. This means that a substantially equal minimum actuation force $f_{MIN}$ is required to actuate the touch sensitive device 110 at all points of the front surface 108 of the bezel 106, even around the edges. Accordingly, the dimmer 100 of the present invention provides a maximum operational area in an opening of a faceplate, i.e., substantially all of the second area $A_2$ of the front surface 108 of the bezel 106, which is an improvement over the prior art touch dimmers. The minimum actuation force $f_{MIN}$ is substantially equal at all points on the front surface 108 of the bezel 106. For example, the minimum actuation force $f_{MIN}$ may be 20 grams.

Since the force profile of the bezel 106 shown in FIG. 6(a) and the force profile of the elastomer 126 shown in FIG. 6(c) have substantially small minimum actuation forces, the minimum actuation force $f_{MIN}$ of the total force profile of the touch dimmer 100 is substantially equal to the minimum force of the force profile of the touch sensitive device 110. Accordingly, the minimum actuation force $f_{MIN}$ of the total force profile is dependent on the selection of the touch sensitive device 110 to be used in the dimmer 100.

FIG. 7 is a simplified block diagram of the touch dimmer 100 according to the present invention. The dimmer 100 has a hot terminal 202 connected to an AC voltage source 204 and a dimmed hot terminal 206 connected to a lighting load 208. The dimmer 100 employs a bidirectional semiconductor switch 210 coupled between the hot terminal 202 and the dimmed hot terminal 206, to control the current through, and thus the intensity of, the lighting load 208. The semiconductor switch 210 has a control input (or gate), which is connected to a gate drive circuit 212. The input to the gate renders the semiconductor switch 210 selectively conductive or non-conductive, which in turn controls the power supplied to the lighting load 208. The gate drive circuit 212 provides a control input to the semiconductor switch 210 in response to a control signal from a controller 214. The controller 214 may be any suitable controller, such as a microcontroller, a microprocessor, a programmable logic device (PLD), or an application specific integrated circuit (ASIC).

A zero-crossing detect circuit 216 determines the zero-crossing points of the AC source voltage from the AC power supply 204. A zero-crossing is defined as the time at which the AC supply voltage transitions from positive to negative polarity, or from negative to positive polarity, at the beginning of each half-cycle. The zero-crossing information is provided as an input to the controller 214. The controller 214 generates the gate control signals to operate the semiconductor switch 210 to thus provide voltage from the AC power supply 204 to the lighting load 208 at predetermined times relative to the zero-crossing points of the AC waveform. A power supply 218 generates a direct-current (DC) voltage $V_{CC}$, e.g., 5 volts, to power the controller 214 and other low voltage circuitry of the dimmer 100.

The touch sensitive device 110 is coupled to the controller 214 through a stabilizing circuit 220 and a usage detection circuit 222. The stabilizing circuit 220 is operable to stabilize the voltage output of the touch sensitive device 110. Accordingly, the voltage output of the stabilizing circuit 220 is not dependent on the magnitude of the force of the point actuation on the touch sensitive device 110, but rather is dependent solely on the position of the point actuation. The usage detection circuit 222 is operable to detect when a user is actuating the front surface 108 of the dimmer 100. The controller 214 is operable to control the operation of the stabilizing circuit 220 and the usage detection circuit 222 and to receive control signals from both the stabilizing circuit and the usage detection circuit. Preferably, the stabilizing circuit 220 has a slow response time, while the usage detection circuit 222 has a fast response time. Thus, the controller 214 is operable to control the semiconductor switch 210 in response to the control signal provided by the stabilizing circuit 220 when the usage detection circuit 222 has detected an actuation of the touch sensitive device 110.

The controller 214 is operable to drive the plurality of status indicators 114, e.g., light-emitting diodes (LEDs), which are located behind the markers 112 on the front surface 108 of the dimmer 100. The status indicators 114 also comprise the blue status indicator and the orange status indicator that are located immediately behind the icon 116. The blue status indicator and the orange status indicator may be implemented as separate blue and orange LEDs, respectively, or as a single bi-colored LED.

The dimmer 100 further comprises an audible sound generator 224 coupled to the controller 214, such that the controller is operable to cause the sound generator to produce an audible sound in response to an actuation of the touch sensitive device 110. A memory 225 is coupled to the controller 214 and is operable to store control information of the dimmer 100.

Figure 8:
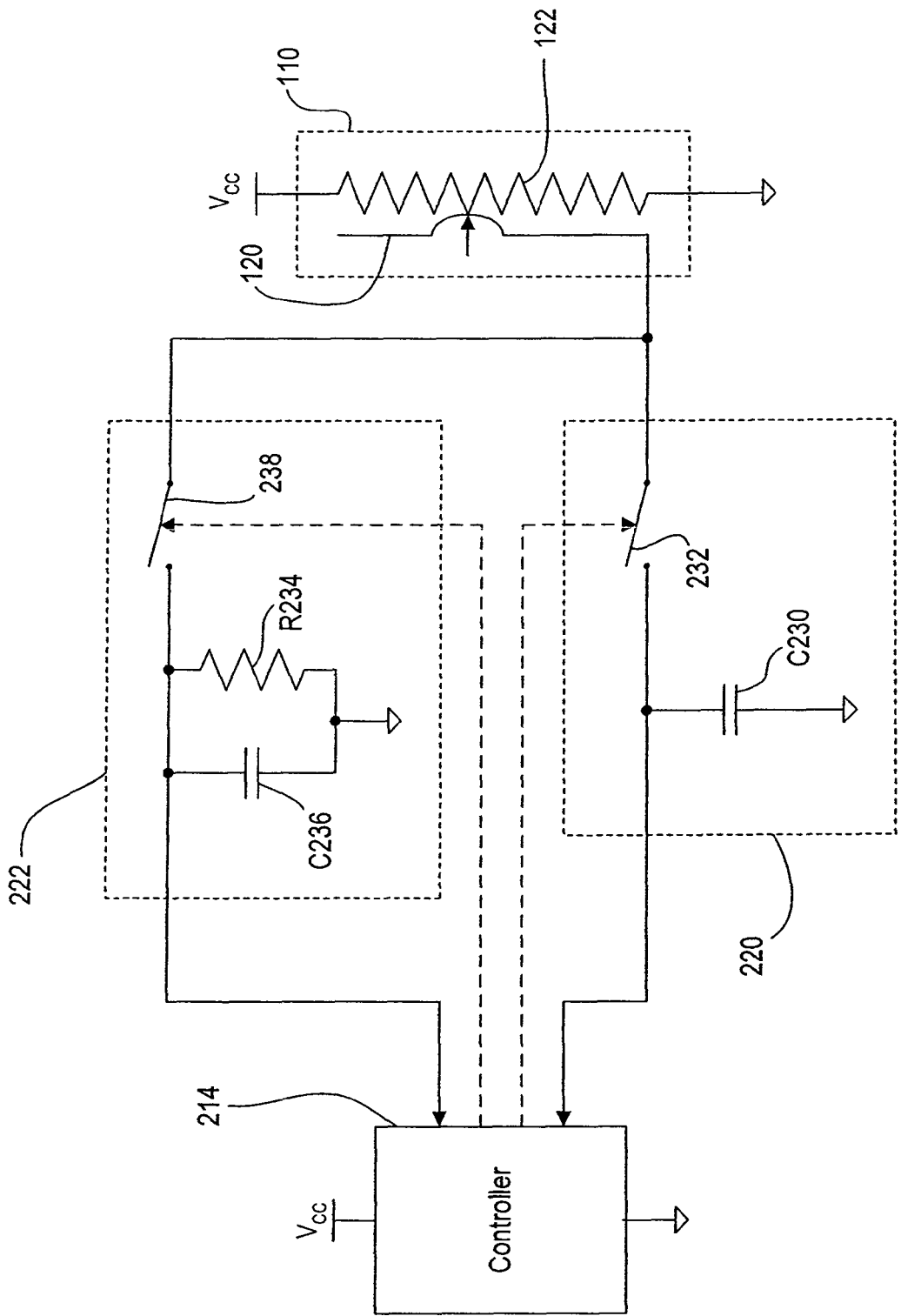
FIG. 8 is a simplified schematic diagram of a stabilizing circuit and a usage detection circuit of the touch dimmer of FIG. 7 according to a first embodiment of the present invention.

FIG. 8 is a simplified schematic diagram of the circuitry for the touch sensitive device 110 and the controller 214, i.e., the stabilizing circuit 220 and the usage detection circuit 222, according to a first embodiment of the present invention. The resistive element 122 of the touch sensitive device 110 is coupled between the DC voltage $V_{CC}$ of the power supply 218 and circuit common, such that the DC voltage $V_{CC}$ provides a biasing voltage to the touch sensitive device. The resistance of the resistive element 122 may be, for example, 7.6 kΩ. The position of contact between the conductive element 120 and the resistive element 122 of the touch sensitive device 110 is determined by the position of a point actuation on the front surface 108 of the bezel 106 of the dimmer 100. The conductive element 120 is coupled to both the stabilizing circuit 220 and the usage detection circuit 222. As shown in FIG. 7, the touch sensitive device 110 of the dimmer 100 of the first embodiment is a three-wire device, i.e., the touch sensitive device has three connections or electrodes. The touch sensitive device provides one output that is representative of the position of the point actuation along a Y-axis, i.e., a longitudinal axis of the dimmer 100 as shown in FIG. 3.

The stabilizing circuit 220 comprises a whacking-grade capacitor C230 (that is, a capacitor having a large value of capacitance) and a first switch 232. The controller 214 is operable to control the first switch 232 between a conductive state and a non-conductive state. When the first switch 232 is conductive, the capacitor C230 is coupled to the output of the touch sensitive device 110, such that the output voltage is filtered by the capacitor C230. When a touch is present, the voltage on the capacitor C230 will be forced to a steady-state voltage representing the position of the touch on the front surface 108. When no touch is present, the voltage on the capacitor will remain at a voltage representing the position of the last touch. The touch sensitive device 110 and the capacitor C230 form a sample-and-hold circuit. The response time of the sample-and-hold circuit is determined by a resistance $R_D$ of the touch sensitive device (i.e., the resistance $R_E$ of the resistive element and a contact resistance $R_C$) and the capacitance of the capacitor C230. During typical actuation, the contact resistance $R_C$ is small compared to the value of $R_E$, such that a first charging time constant $\tau_1$ is approximately equal to $R_E \cdot C_{230}$. This time constant $\tau_1$ is preferably 13 ms, but may be anywhere between 6 ms and 15 ms.

When a light or transient press is applied to the touch sensitive device 110, the capacitor C230 will continue to hold the output at the voltage representing the position of the last touch. During the release of the touch sensitive device 110, transient events may occur that produce output voltages that represent positions other than the actual touch position. Transient presses that are shorter than the first charging time constant $\tau_1$ will not substantially affect the voltage on the capacitor C230, and therefore will not substantially affect the sensing of the position of the last actuation. During a light press, a second charging time constant $\tau_2$ will be substantially longer than during normal presses, i.e., substantially larger than the first time constant $\tau_1$, due to the higher contact resistance $R_C$. However, the steady-state value of the voltage across the capacitor C230 will be the same as for a normal press at the same position. Therefore, the output of the stabilizing circuit 220 is representative of only the position of the point of actuation of the touch sensitive device 110.

The usage detection circuit 222 comprises a resistor R234, a capacitor C236, and a second switch 238, which is controlled by the controller 214. When the switch 238 is conductive, the parallel combination of the resistor R234 and the capacitor C236 is coupled to the output of the touch sensitive device 110. Preferably, the capacitor C236 has a substantially small capacitance $C_{236}$, such that the capacitor C236 charges substantially quickly in response to all point actuations on the front surface 108. The resistor R234 allows the capacitor C236 to discharge quickly when the switch 238 is non-conductive. Therefore, the output of the usage detection circuit 222 is representative of the instantaneous usage of the touch sensitive device 110.

The controller 214 controls the switches 232, 238 in a complementary manner. When the first switch 232 is conductive, the second switch 238 is non-conductive, and vice versa. The controller 214 controls the second switch 238 to be conductive for a short period of time $t_{USAGE}$ once every half cycle of the voltage source 204 to determine whether the user is actuating the front surface 108. Preferably, the short period of time $t_{USAGE}$ is approximately 100 μsec or 1% of the half-cycle (assuming each half-cycle is 8.33 msec long). For the remainder of the time, the first switch 232 is conductive, such that the capacitor C230 is operable to charge accordingly. When the first switch 232 is non-conductive and the second switch 238 is conductive, the whacking-grade capacitor C230 of the stabilizing circuit 220 is unable to discharge at a significant rate, and thus the voltage developed across the capacitor C230 will not change significantly when the controller 214 is determining whether the touch sensitive device 110 is being actuated through the usage detection circuit 222.

Figure 9:
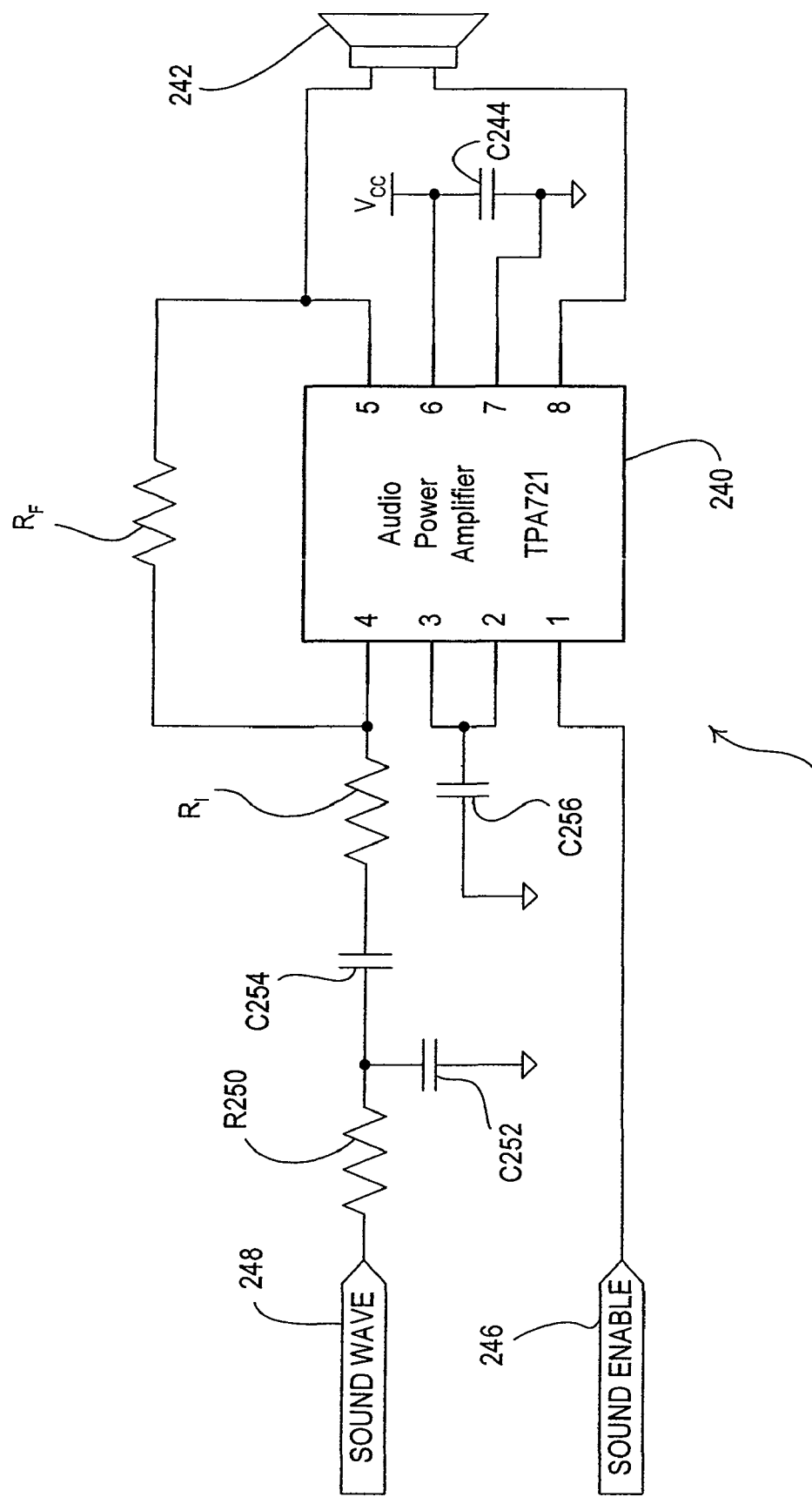
FIG. 9 is a simplified schematic diagram of an audible sound generator of the touch dimmer of FIG. 7.

FIG. 9 is a simplified schematic diagram of the audible sound generator 224 of the dimmer 100. The audible sound generator 224 uses an audio power amplifier integrated circuit (IC) 240, for example, part number TPA721 manufactured by Texas Instruments, Inc., to generate a sound from a piezoelectric or magnetic speaker 242. The amplifier IC 240 is coupled to the DC voltage $V_{CC}$ (pin 6) and circuit common (pin 7) to power the amplifier IC. A capacitor C244 (preferably having a capacitance of 0.1 μF) is coupled between the DC voltage $V_{CC}$ and circuit common to decouple the power supply voltage and to ensure the output total harmonic distortion (THD) is as low as possible.

The audible sound generator 224 receives a SOUND ENABLE signal 246 from the controller 214. The SOUND ENABLE signal 246 is provided to an enable pin (i.e., pin 1) on the amplifier IC 240, such that the audible sound generator 224 will be operable to generate the sound when the SOUND ENABLE signal is at a logic high level.

The audible sound generate 224 further receives a SOUND WAVE signal 248 from the controller 214. The SOUND WAVE signal 248 is an audio signal that is amplified by the amplifier IC 240 to generate the appropriate sound at the speaker 242. The SOUND WAVE signal 248 is first filtered by a low-pass filter comprising a resistor R250 and a capacitor C252. Preferably, the resistor R250 has a resistance of 1 kΩ and the capacitor C252 has a capacitance of 0.1 nF. The filtered signal is then passed through a capacitor C254 to produce an input signal $V_{IN}$. The capacitor C254 allows the amplifier IC to bias the input signal $V_{IN}$ to the proper DC level for optimum operation and preferably has a capacitance of 0.1 μF. The input signal $V_{IN}$ is provided to a negative input (pin 4) of the amplifier IC 240 through a input resistor $R_1$. A positive input (pin 3) of the amplifier IC 240 and with a bypass pin (pin 2) are coupled to circuit common through a bypass capacitor C256 (preferably, having a capacitance of 0.1 μF).

The output signal $V_{OUT}$ of the amplifier IC 240 is produced from a positive output (pin 5) to a negative output (pin 8) and is provided to the speaker 242. The negative input (pin 4) is coupled to the positive output (pin 5) through an output resistor $R_F$. The gain of the amplifier IC 240 is set by the input resistor $R_1$ and the feedback resistor $R_F$, i.e., $$\text{Gain} = V_{OUT}/V_{IN} = -2(R_F/R_1).$$

Preferably, the input resistor $R_1$ and the output resistor $R_F$ both have resistances of 10 kΩ, such that the gain of the amplifier IC 240 is negative two (−2).

Figure 10:
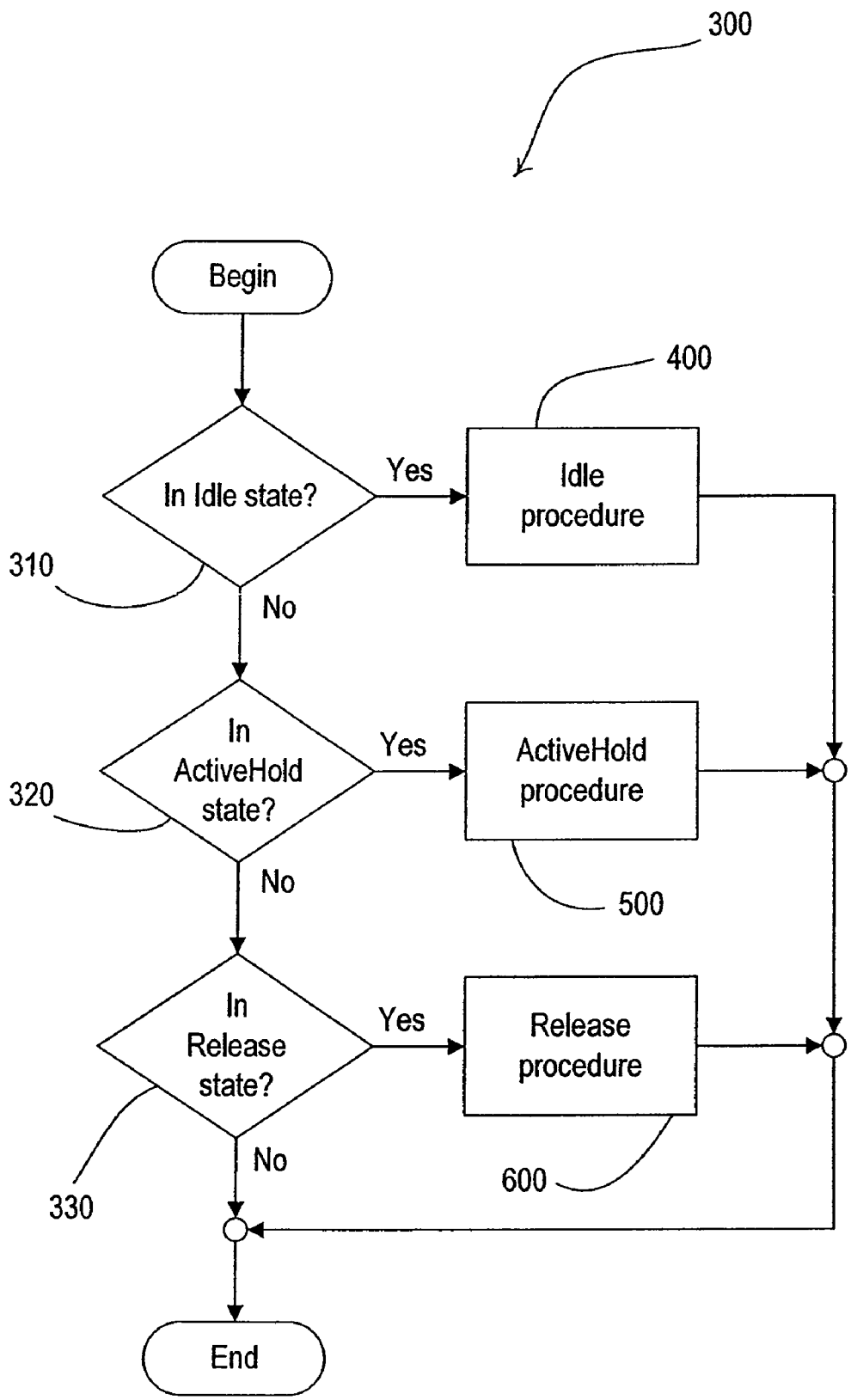
FIG. 10 is a flowchart of a touch dimmer procedure executed by a controller of the dimmer of FIG. 2.

FIG. 10 is a flowchart of a touch dimmer procedure 300 executed by the controller 214 of the dimmer 100 according to the present invention. Preferably, the touch dimmer procedure 300 is called from the main loop of the software of the controller 214 once every half cycle of the AC voltage source 204. The touch dimmer procedure 300 selectively executes one of three procedures depending upon the state of the dimmer 100. If the dimmer 100 is in an "Idle" state (i.e., the user is not actuating the touch sensitive device 110) at step 310, the controller 214 executes an Idle procedure 400. If the dimmer 100 is in an "ActiveHold" state (i.e., the user is presently actuating the touch sensitive device 110) at step 320, the controller 214 executes an ActiveHold procedure 500. If the dimmer 100 is in a "Release" state (i.e., the user has recently ceased actuating the touch sensitive device 110) at step 330, the controller 214 executes a Release procedure 600.

FIG. 11 is a flowchart of the Idle procedure 400 according to the present invention. The controller 114 uses a "sound flag" and a "sound counter" to determine when to cause the audible sound generator 224 to generate the audible sound. The purpose of the sound flag is to cause the sound to be generated the first time that the controller 214 executes the ActiveHold procedure 500 after being in the Idle state. If the sound flag is set, the controller 214 will cause the sound to be generated. The sound counter is used to ensure that the controller 214 does not cause the audible sound generator 224 to generate the audible sound too often. The sound counter preferably has a maximum sound counter value $S_{MAX}$, e.g., approximately 425 msec. Accordingly, there is a gap of approximately 425 msec between generations of the audible sound. The sound counter is started during the Release procedure 600 as will be described in greater detail below. Referring to FIG. 11, upon entering the Idle state, the controller 214 sets the sound flag at step 404 if the sound flag is not set at step 402.

An "LED counter" and the LED modes (i.e., the active LED mode and the inactive LED mode) are used by the controller 214 to control the status indicators 114 of the dimmer 100. The controller 214 uses the LED counter to determine when a predetermined time $t_{ACTIVE}$ has expired since the touch sensitive device 110 was actuated. When the predetermined time $t_{ACTIVE}$ has expired, the controller 214 will change the LED mode from "active" to "inactive". When the LED mode is "active", the status indicators 114 are controlled such that one or more of the status indicators are illuminated to a bright Active level. When the predetermined time $t_{ACTIVE}$ expires, the LED mode is changed to "inactive", i.e., the status indicators 114 are controlled such that one or more of the status indicators are faded to a dim Idle level, i.e., the intensity of the status indicators is reduced to the dim Idle level slowly over a period of time. Referring to FIG. 11, if the LED counter is less than a maximum LED counter value $L_{MAX}$ at step 410, the LED counter is incremented at step 412 and the process moves on to step 418. However, if the LED counter is not less than the maximum LED counter value $L_{MAX}$, the LED counter is cleared at step 414 and the LED mode is set to inactive at step 416. Since the touch dimmer procedure 300 is executed once every half cycle, the predetermined time $t_{ACTIVE}$ is equal to $$t_{ACTIVE} = T_{HALF} \cdot L_{MAX},$$

where $T_{HALF}$ is the period of a half cycle. For example, the predetermined time $t_{ACTIVE}$ may be 4 to 5 seconds.

Next, the controller 214 reads the output of the usage detection circuit 222 to determine if the touch sensitive device 110 is being actuated. Preferably, the usage detection circuit 222 is monitored once every half cycle of the voltage source 204. At step 418, the controller 214 opens switch 232 and closes switch 238 to couple the resistor R234 and the capacitor C236 to the output of the touch sensitive device 110. The controller 214 determines the DC voltage of the output of the usage detection circuit 222 at step 420, preferably, by using an analog-to-digital converter (ADC). Next, the controller 214 closes switch 232 and opens switch 238 at step 422.

At step 424, if there is activity on the front surface 108 of the dimmer 100, i.e., if the DC voltage determined at step 420 is above a predetermined minimum voltage threshold, then an "activity counter" is incremented at step 426. Otherwise, the activity counter is cleared at step 428. The activity counter is used by the controller 214 to determine if the DC voltage determined at step 420 is the result of a point actuation of the touch sensitive device 110 rather than noise or some other undesired impulse. The use of the activity counter is similar to a software "debouncing" procedure for a mechanical switch, which is well known in the art. If the activity counter is not less than a maximum activity counter value $A_{MAX}$ at step 430, then the dimmer state is set to the ActiveHold state at step 432. Otherwise, the process simply exits at step 434.

Figure 12A:
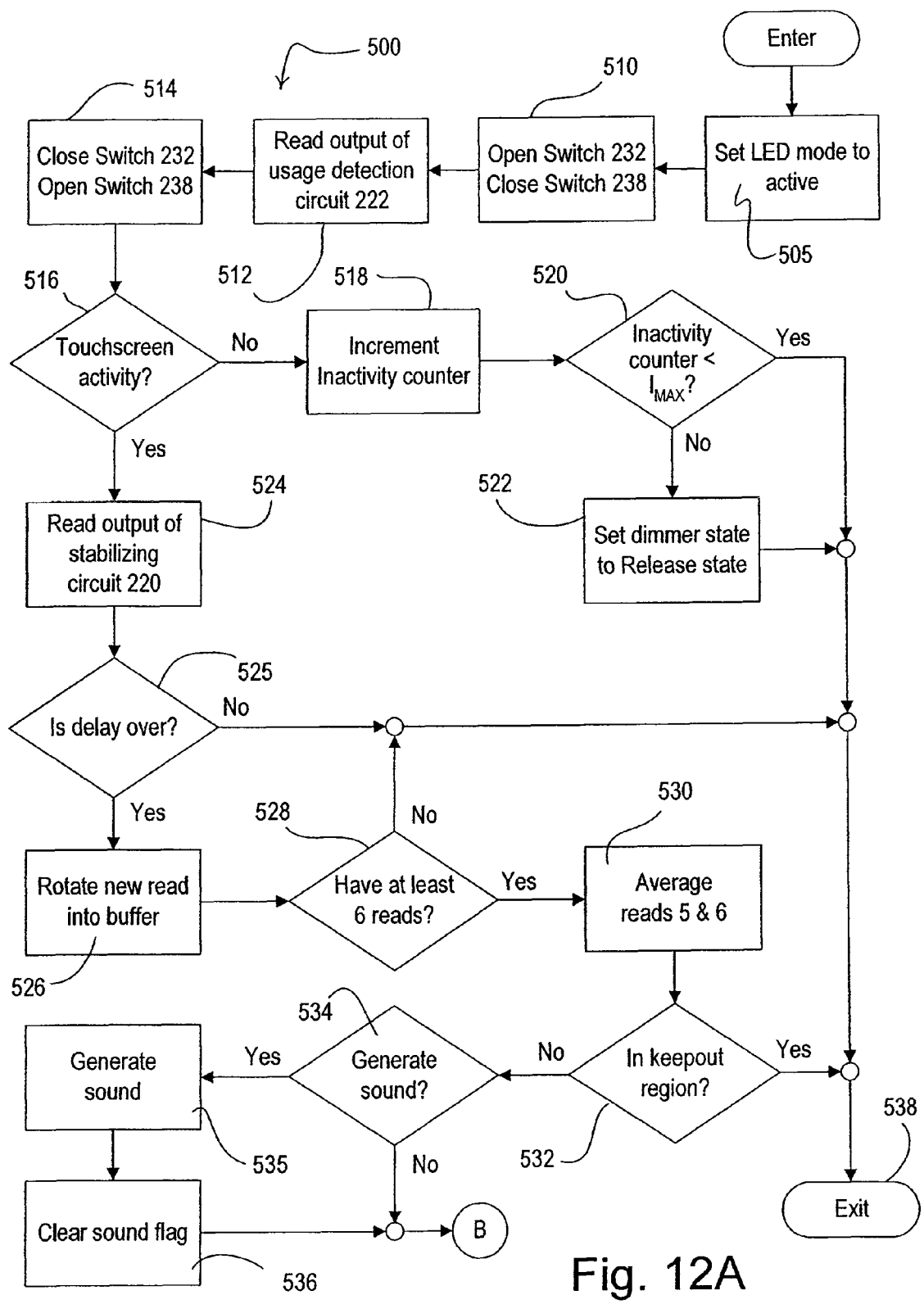
FIGS. 12A and 12B are flowcharts of an ActiveHold procedure of the touch dimmer procedure of FIG. 10.
Figure 12B:
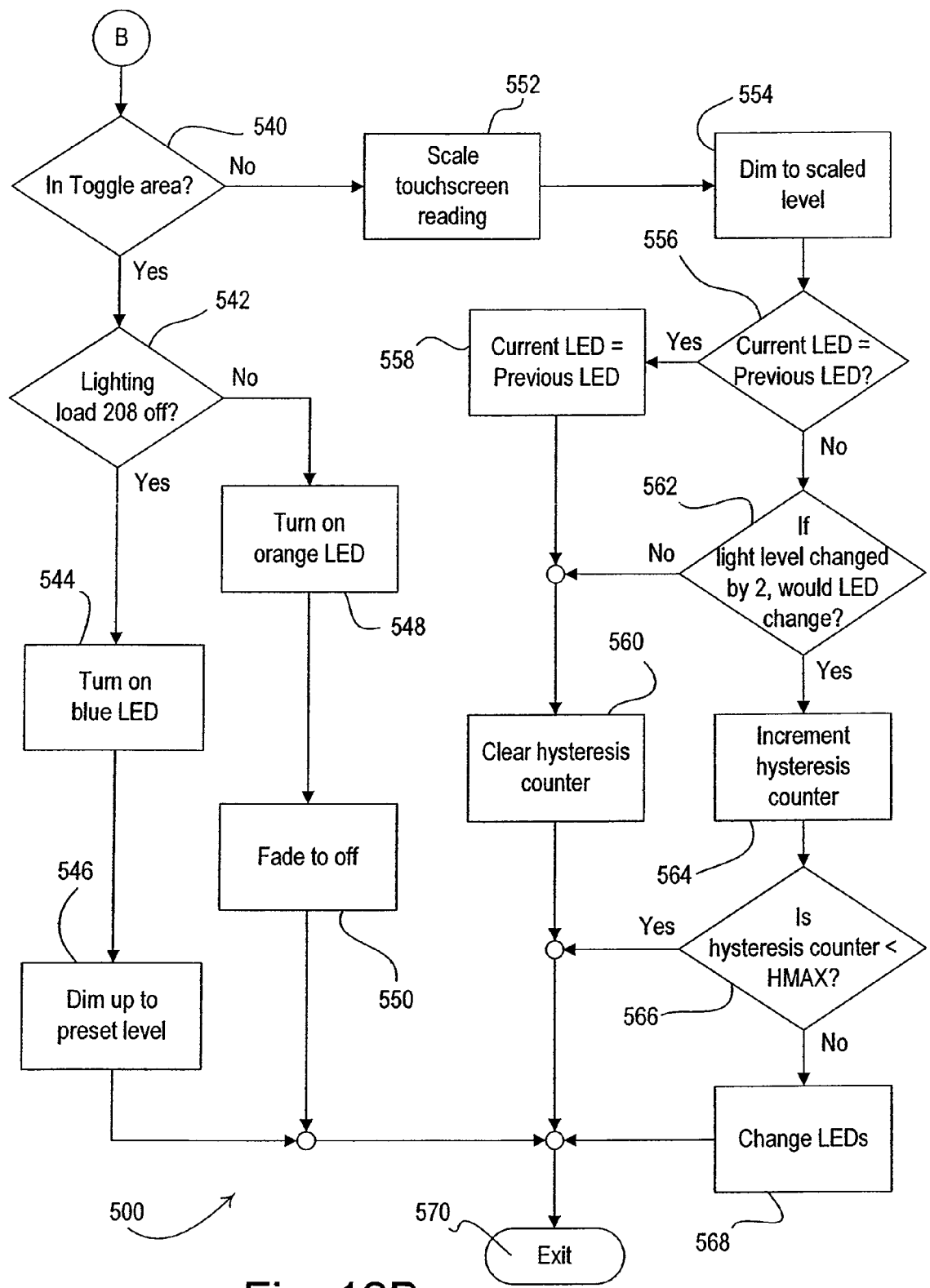

FIGS. 12A and 12B are flowcharts of the ActiveHold procedure 500, which is executed once every half cycle when the touch sensitive device 110 is being actuated, i.e., when the dimmer 100 is in the ActiveHold state. First, a determination is made as to whether the user has stopped using, i.e., released, the touch sensitive device 110. The controller 214 opens switch 232 and closes switch 238 at step 510, and reads the output of the usage detection circuit 222 at step 512. At step 514, the controller 214 closes switch 232 and opens switch 238. If there is no activity on the front surface 108 of the dimmer 100 at step 516, the controller 214 increments an "inactivity counter" at step 518. The controller 214 uses the inactivity counter to make sure that the user is not actuating the touch sensitive device 110 before entering the Release mode. If the inactivity counter is less than a maximum inactivity counter value $I_{MAX}$ at step 520, the process exits at step 538. Otherwise, the dimmer state is set to the Release state at step 522, and then the process exits.

If there is activity on the touch sensitive device 110 at step 516, the controller 214 reads the output of the stabilizing circuit 220, which is representative of the position of the point actuation on the front surface 108 of the dimmer 100. Since the switch 232 is conductive and the switch 238 is non-conductive, the controller 214 determines the DC voltage at the output of the stabilizing circuit 220, preferably using an ADC, at step 524.

Next, the controller 214 uses a buffer to "filter" the output of stabilizing circuit 220. When a user actuates the touch sensitive device 110, the capacitor C230 will charge to approximately the steady-state voltage representing the position of the actuation on the front surface 108 across a period of time determined by the first time constant $\tau_1$ as previously described. Since the voltage across the capacitor C230, i.e., the output of the stabilizing circuit 220, is increasing during this time, the controller 214 delays for a predetermined period of time at step 525, preferably, for approximately three (3) half cycles.

When a user's finger is removed from the front surface 108 of the bezel 106, subtle changes in the force and position of the point actuation occur, i.e., a "finger roll-off" event occurs. Accordingly, the output signal of the touch sensitive device 110 is no longer representative of the position of the point actuation. To prevent the controller 214 from processing reads during a finger roll-off event, the controller 214 saves the reads in the buffer and processes the reads with a delay, e.g., six half cycles later. Specifically, when the delay is over at step 525, the controller 214 rotates the new read (i.e., from step 524) into the buffer at step 526. If the buffer has at least six reads at step 528, the controller 214 averages the reads in the fifth and sixth positions in the buffer at step 530 to produce the touch position data. In this way, when the user stops actuating the touch sensitive device 110, the controller 214 detects this change at step 516 and sets the dimmer state to the Release state at step 522 before the controller processes the reads saved in the buffer near the transition time of the touch sensitive device.

At step 532, the controller 114 determines if the touch position data from step 530 is in the keepout region 118 (as shown in FIG. 3). If the touch position data is in the keepout region 118, the ActiveHold procedure 500 simply exits at step 538. Otherwise, a determination is made at step 534 as to whether the sound should be generated. Specifically, if the sound flag is set and if the sound counter has reached a maximum sound counter value $S_{MAX}$, the controller 214 drives the SOUND ENABLE signal 246 high and provides the SOUND WAVE signal 248 to the audible sound generator 224 to generate the sound at step 535. Further, the sound flag is cleared at step 536 such that the sound will not be generated as long as the dimmer 100 remains in the ActiveHold state.

If the touch position data is in the toggle area, i.e., the lower portion of the front surface 108 of the bezel 106 surrounding the icon 116 (as shown in FIG. 2), at step 540, the controller 214 processes the actuation of the touch sensitive device 110 as a toggle. If the lighting load 208 is presently off at step 542, the controller 214 turns the lighting load on. Specifically, the controller 214 illuminates the icon 116 with the blue status indicator at step 544 and dims the lighting load 208 up to the preset level, i.e., the desired lighting intensity of the lighting load, at step 546. If the lighting load is presently on at step 542, the controller 214 turns on the orange status indicator behind the icon 116 at step 548 and fades the lighting load 208 to off at step 550.

If the touch position data is not in the toggle area at step 540, the controller 214 scales the touch position data at step 552. The output of the stabilizing circuit 220 is a DC voltage between a maximum value, i.e., substantially the DC voltage $V_{CC}$, and a minimum value, which corresponds to the DC voltage providing by the touch sensitive device 110 when a user is actuating the lower end of the upper portion of the front surface 108 of the bezel 106. The controller 214 scales this DC voltage to be a value between off (i.e., 1%) and full intensity (i.e., 100%) of the lighting load 208. At step 554, the controller 214 dims the lighting load 208 to the scaled level produced in step 552.

Next, the controller 214 changes the status indicators 114 located behind the markers 112 on the front surface 108 of the bezel 106. As a user actuates the touch sensitive device 110 to change intensity of the lighting load 208, the controller 214 decides whether to change the status indicator 114 that is presently illuminated. Since there are seven (7) status indicators to indicate an intensity between 1% and 100%, the controller 214 may illuminate the first status indicator, i.e., the lowest status indicator, to represent an intensity between 1% and 14%, the second status indicator to represent an intensity between 15% and 28%, and so on. The seventh status indicator, i.e., the highest status indicator, may be illuminated to represent an intensity between 85% and 100%. Preferably, the controller 214 uses hysteresis to control the status indicators 114 such that if the user actuates the front surface 108 at a boundary between two of the regions of intensities described above, consecutive status indicators do not toggle back and forth.

Referring to FIG. 12B, a determination is made as to whether a change is needed as to which status indicator is illuminated at step 556. If the present LED (in result to the touch position data from step 530) is the same as the previous LED, then no change in the LED is required. The present LED is set the same as the previous LED at step 558, a hysteresis counter is cleared at step 560, and the process exits at step 570.

If the present LED is not the same as the previous LED at step 556, the controller 214 determines if the LED should be changed. Specifically, at step 562, the controller 214 determines if present LED would change if the light level changed by 2% from the light level indicated by the touch position data. If not, the hysteresis counter is cleared at step 560 and the process exits at step 570. Otherwise, the hysteresis counter is incremented at step 564. If the hysteresis counter is less than a maximum hysteresis counter value $H_{MAX}$ at step 566, the process exits at step 570. Otherwise, the LEDs are changed accordingly based on the touch position data at step 568.

Figure 13:
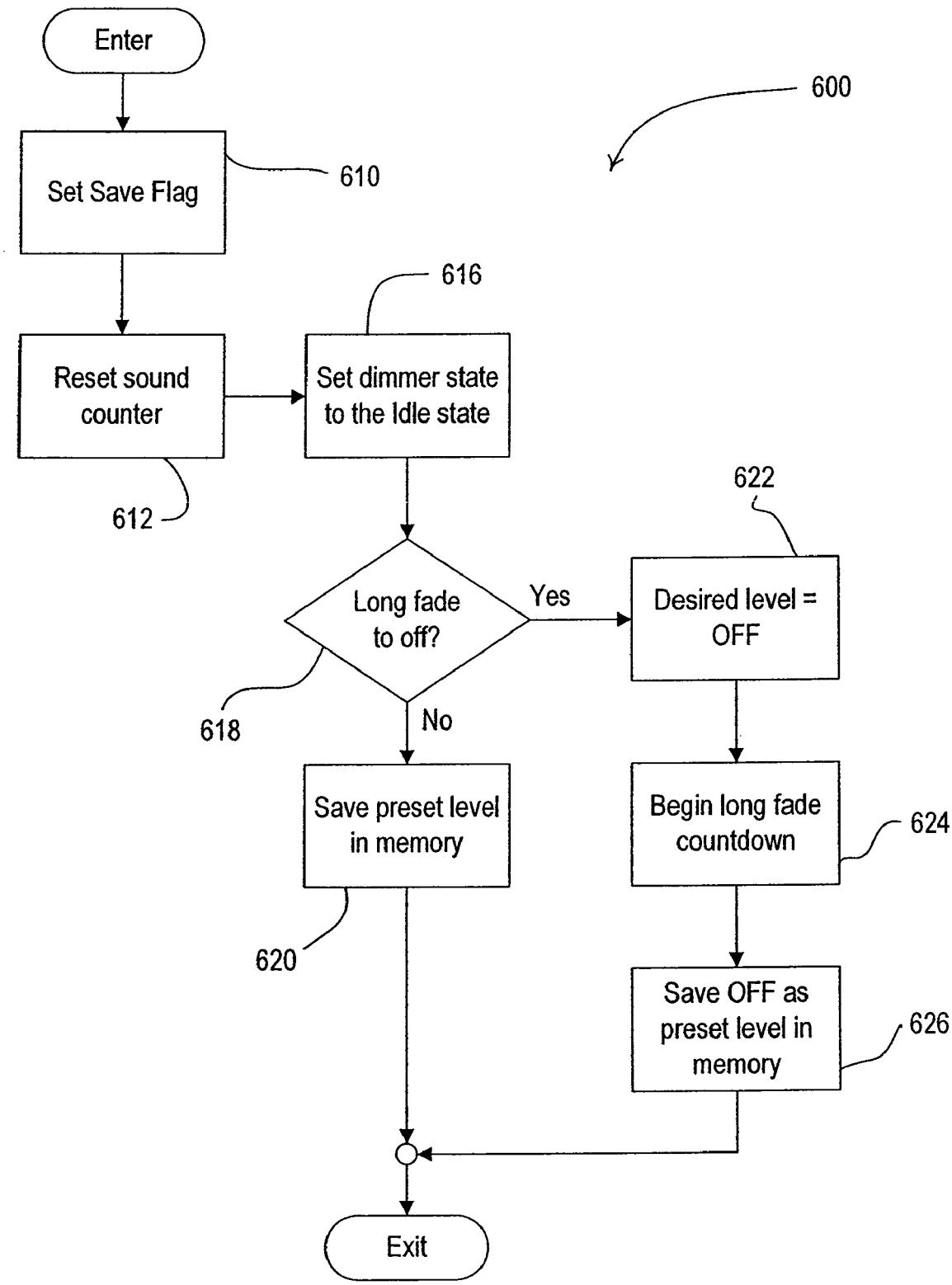
FIG. 13 is a flowchart of a Release procedure of the touch dimmer procedure of FIG. 10.

FIG. 13 is a flowchart of the Release procedure 600, which is executed after the controller 214 sets the dimmer state to the Release state at step 522 of the ActiveHold procedure 500. First, a save flag is set at step 610. Next, the sound counter is reset at step 612 to ensure that the sound will not be generated again, e.g., for preferably 18 half cycles. At step 618, a determination is made as to whether the dimmer 100 is presently executed a fade-to-off. If not, the present level is saved as the preset level in the memory 225 at step 620. Otherwise, the desired lighting intensity is set to off at step 622, the long fade countdown in started at step 624, and the preset level is saved as off in the memory 225.

Figure 14:
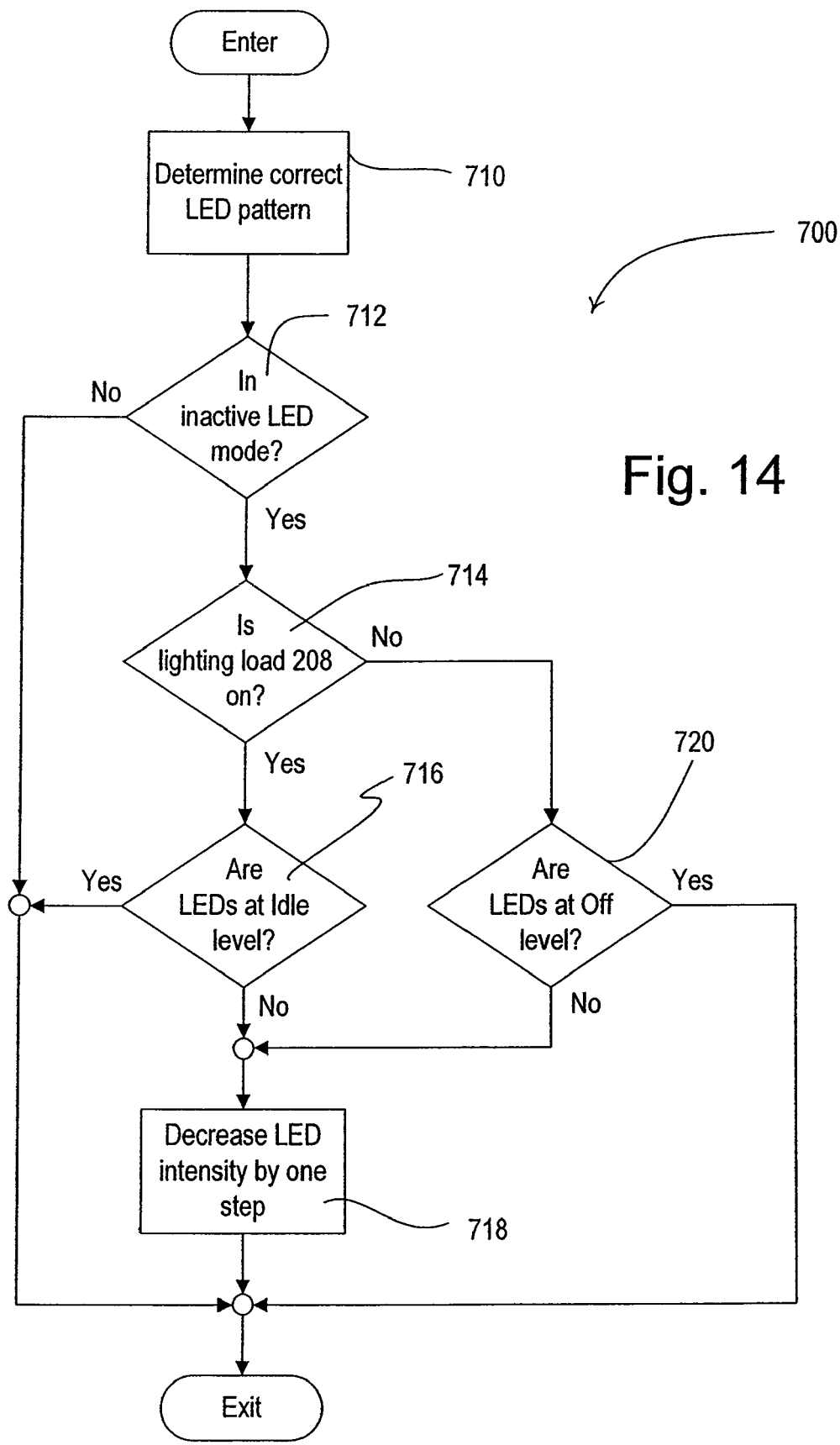
FIG. 14 is a flowchart of a LED Mode procedure executed by the controller of the dimmer of FIG. 2.

FIG. 14 is a flowchart of a LED Mode procedure 700 that is preferably executed once every line cycle of the AC power source. At step 710, the controller 214 determines the correct pattern of the status indicators 114, i.e., which status indicator should be illuminated greater than the other status indicators. If the dimmer 100 is in the inactive LED mode at step 712 and if the lighting load 208 is on at step 714, a determination is made at step 716 as to whether the LEDs are presently at the desired intensity level, i.e., the dim Idle level. If not, the intensity of the LEDs is decreased by a predetermined step at 718. If the lighting load 208 is not on at step 714 and if the LEDs are not at the dim Off level at step 720, the intensity of the LEDs is decreased by the predetermined step at step 718. Preferably, the predetermined step is sized such that the LEDs fade to the dim Idle level over approximately 0.5 seconds and to the dim Off level over approximately 0.75 seconds.

While the present invention has been described as implemented in the touch dimmer 100, the present invention may be applied to any sort of dimmer or load control device comprising a plurality of status indicators.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A load control device for controlling the amount of power delivered from an AC power source to an electrical load, the load control device comprising:
   a bidirectional semiconductor switch operable to be coupled in series electrical connection between the source and the load, the semiconductor switch having a control input;
   a controller operatively coupled to the control input of the semiconductor switch for controlling the amount of power delivered to the load;
   an actuator operatively coupled to the controller such that the controller is operable to determine a desired amount of power to be delivered to the load in response to actuations of the actuator; and
   a visual display responsive to the controller;
   wherein the controller is operable to illuminate the visual display to a first intensity upon actuation of the actuator and to subsequently illuminate the visual display to a second intensity less than the first intensity after a predetermined amount of time has elapsed since the actuation of the actuator.

2. The load control device of claim 1, wherein the visual display comprises a linear array of status indicators.

3. The load control device of claim 2, wherein the controller is operable to illuminate the linear array of status indicators to display a representation of the desired amount of power to be delivered to the load.

4. The load control device of claim 3, wherein the controller is operable to illuminate a plurality of adjacent status indicators of the linear array to the first intensity to represent the desired amount of power to be delivered to the load upon actuation of the actuator, and to subsequently illuminate the plurality of adjacent status indicators of the linear array to the second intensity to represent the desired amount of power to be delivered to the load after the predetermined amount of time has elapsed since the actuation of the actuator.

5. The load control device of claim 4, wherein the controller is operable to illuminate the plurality of adjacent status indicators of the linear array to a third intensity less than the first and second intensities when the lighting load is off.

6. The load control device of claim 3, wherein the controller is operable to illuminate one of the linear array of status indicators to the first intensity to represent the desired amount of power to be delivered to the load upon actuation of the actuator, and to subsequently illuminate the one of the linear array of status indicators to the second intensity to represent the desired amount of power to be delivered to the load after the predetermined amount of time has elapsed since the actuation of the actuator.

7. The load control device of claim 2, wherein the linear array of status indicators is arranged behind the actuator such that the status indicators shine through the actuator.

8. The load control device of claim 7, wherein the actuator comprises a touch sensitive device responsive to a plurality of point actuations at a touch sensitive front surface of the load control device, each of the plurality of point actuations characterized by a position and a force, the touch sensitive device having an output operatively coupled to the controller for providing a control signal representative of the position of the point actuation.

9. The load control device of claim 2, wherein the status indicators comprise light-emitting diodes.

10. The load control device of claim 1, wherein the first intensity has a magnitude that allows the visual display to be viewed in direct sunlight.

11. The load control device of claim 10, wherein the first intensity allows the visual display to be viewed in approximately 500 footcandles.

12. The load control device of claim 11, wherein the second intensity allows the visual display to be viewed in less than approximately 250 footcandles.

13. The load control device of claim 1, wherein the intensity of the visual display is reduced from the first intensity to the second intensity over a period of time.

14. The load control device of claim 13, wherein the period of time is approximately 0.5 seconds.

15. The load control device of claim 1, wherein the actuation lasts for a period of time between a press and a release of the actuator, and the controller is operable to illuminate the visual display to the first intensity during the period of time between the press and the release of the actuator and for to the predetermined amount of time after the release of the actuator.

16. The load control device of claim 1, wherein the predetermined amount of timer is approximately 5 seconds.

17. The load control device of claim 1, wherein the controller is operable to illuminate the visual display to represent the desired amount of power to be delivered to the load.

18. A method of displaying feedback on a plurality of status indicators of a load control device, the load control device operable to control the amount of power delivered from an AC power source to an electrical load, the method comprising the steps of:
    pressing an actuator;
    subsequently releasing the actuator;
    illuminating the status indicators to a first intensity in response to the step of pressing the actuator; and
    illuminating the status indicators to a second intensity less than the first intensity after a predetermined amount of time has elapsed since the step of releasing the actuator.

19. The method of claim 18, further comprising the step of:
    illuminating the status indicators to represent the amount of power delivered to the load.

20. The method of claim 19, further comprising the steps of:
    illuminating a plurality of adjacent status indicators to the first intensity to represent the desired amount of power to be delivered to the load in response to the step of pressing the actuator; and
    illuminating the plurality of adjacent status indicators to the to the second intensity to represent the desired amount of power to be delivered to the load after the predetermined amount of time has elapsed since the step of releasing the actuator.

21. The method of claim 19, further comprising the steps of:
    illuminating one of the status indicators to the first intensity to represent the desired amount of power to be delivered to the load in response to the step of pressing the actuator; and
    illuminating the one of the status indicators to the to the second intensity to represent the desired amount of power to be delivered to the load after the predetermined amount of time has elapsed since the step of releasing the actuator.

22. The method of claim 18, further comprising the step of:
    reducing the intensity of the status indicators from the first intensity to the second intensity over a period of time.

23. The method of claim 22, wherein the period of time is approximately 0.5 seconds.

24. The method of claim 18, further comprising the step of:
    illuminating the status indicators to a third intensity less than the first and second intensities when the lighting load is off.

25. The method of claim 18, wherein the predetermined amount of timer is approximately 5 seconds.

* * * * *